(12) United States Patent
Yu

(10) Patent No.: US 6,587,501 B2
(45) Date of Patent: Jul. 1, 2003

(54) METHOD AND APPARATUS FOR JOINT DETECTION OF A CODED SIGNAL IN A CDMA SYSTEM

(75) Inventor: Xiaoyong Yu, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 96 days.

(21) Appl. No.: 09/918,250

(22) Filed: Jul. 30, 2001

(65) Prior Publication Data

US 2003/0043886 A1 Mar. 6, 2003

(51) Int. Cl.[7] .................. H04B 1/707; H03M 13/29; H04L 1/00
(52) U.S. Cl. .................. 375/147; 375/233; 375/340; 714/794
(58) Field of Search .................. 375/140, 144, 375/147, 148, 233, 260, 340, 346, 348, 350; 714/758, 766, 792, 794

(56) References Cited

U.S. PATENT DOCUMENTS

| | | | |
|---|---|---|---|
| 6,166,667 A | * | 12/2000 | Park .................. 341/94 |
| 6,182,261 B1 | * | 1/2001 | Haller et al. .................. 714/758 |
| 6,188,735 B1 | * | 2/2001 | Soichi et al. .................. 375/341 |
| 6,223,319 B1 | | 4/2001 | Ross et al. |

FOREIGN PATENT DOCUMENTS

| | | | |
|---|---|---|---|
| WO | WO 01 82488 A | | 11/2001 |
| WO | WO 02084965 A1 | * | 10/2002 |

OTHER PUBLICATIONS

Gamal et al. "Iterative Multiuser Detection for Coded CDMA Signals in AWGN and Fading Channels." *IEEE Journal on Selected Areas in Communications*, IEEE Inc. New York; vol. 18, No. 1, Jan. 2000, pp. 30–41.

Wang, C. "A Soft–Input Soft–Output Decorrlating Block Decision–Feedback Multiuser Detector for Turbo–Coded DS–CDMA Systems." *Wireless Personal Communications*, Kluwer Academic Publishers, NL, vol. 17, No. 1, Apr. 2001, pp. 85–101.

* cited by examiner

*Primary Examiner*—Young T. Tse
(74) *Attorney, Agent, or Firm*—Jeffrey K. Jacobs

(57) ABSTRACT

The present invention achieves the benefits of the improved joint detector previously disclosed with significantly less computation by, first, moving the backward substitution computation outside the detector's decoding iteration loop and, second, by moving the input buffer inside the iteration loop. The backward substitution computation is performed initially as part of a joint detection equalization stage prior to entering the decode iteration loop. Then with each decode iteration, the present invention generates a correction signal that is subtracted from the present input signal to produce the next input signal. Each correction signal is generated from a series of differences between the decoded symbols of the current iteration and those in the previous iteration. Thus, the present invention achieves the same performance improvement over conventional joint detectors as the improved joint detector previously disclosed but with dramatically less computational requirements.

16 Claims, 4 Drawing Sheets

FIG. 1 —PRIOR ART—

METHOD AND APPARATUS FOR JOINT DETECTION OF A CODED SIGNAL IN A CDMA SYSTEM

CROSS-REFERENCE TO RELATED APPLICATION

This application is related to two co-pending applications, "TURBO DECODER WITH DECISION FEEDBACK EQUALIZATION", Ser. No. 09/563,064, filed on Apr. 24, 2000, now U.S. Pat. No. 6,307,901 B1, and "METHOD AND APPARATUS FOR JOINT DETECTION OF A CODED SIGNAL IN A CDMA SYSTEM", Ser. No. 09/798, 305, filed on Mar. 2, 2001, both assigned to the assignee of the present application, which prior applications are hereby incorporated by reference verbatim, with the same effect as though the prior applications were fully and completely set forth herein.

FIELD OF THE INVENTION

The present invention relates generally to communication systems and, in particular, to joint detection of a coded signal in a CDMA system.

BACKGROUND OF THE INVENTION

FIG. 1 depicts a discrete time baseband model 100 of a known CDMA system that supports K block transmission users. These users have simultaneous access to the same physical, frequency-defined channel and transmit data block by block, each block having N symbols. Each user, 1 through K, has a sequence of information bits, $d^{(1)}$ through $d^{(K)}$, to be transmitted. Each user's sequence is first turbo encoded and mapped to channel symbol sequences $s^{(1)}$ through $s^{(K)}$ respectively. These channel symbol sequences are then spread by their corresponding code $C^{(1)}$ through $C^{(K)}$, each of which has Q random chips, and passed through their corresponding channel, characterized by impulse responses $h^{(1)}$ through $h^{(K)}$ with W taps at chip level. For simplicity, it is assumed that this system uses BPSK modulation, so $s^{(1)}$ through $s^{(K)}$ are sequences of 1 and −1, and the physical channel is an additive white Gaussian noise (AWGN) channel.

At the receive end, the received signal r can be expressed:

$$r = \sum_{k=1}^{K} s^{(k)} C^{(k)} \otimes h^{(k)} + n$$
$$= As + n$$

where r is a summation of K sequences and n represents channel noise, each of the length (NQ+W−1). A is a (NQ+W−1) by NK matrix consisting of:

$$a^{(k)} = (a_1^{(k)}, a_2^{(k)}, \ldots, a_{Q+W-1}^{(k)}) = C^{(k)} \otimes h^{(k)}$$

and s is a composite symbol vector combining all symbols of the K users and arranged in the following order:

$$s = (s_1^{(1)}, s_1^{(2)}, \ldots, s_1^{(K)}, s_1^{(1)}, s_2^{(2)}, \ldots, s_2^{(K)}, s_3^{(1)}, \ldots, s_N^{(1)}, \ldots, s_N^{(K)})^T$$

where T denotes the transposition operation. The received signal r is passed through a bank of matched filters, each one matches $a^{(k)}$. The output of the matched filter bank, y, is a minimum sufficient statistic of transmitted signals for all K users and can be expressed as:

$$y = A^H r = A^H A s + z = Rs + z$$

where y, s, and z are NK by 1 vectors, and R is an NK by NK block toeplitz matrix. By using Cholesky factorization, R can be written as:

$$R = LL^H = L_n D L_n^H$$

where L is a lower triangular matrix, $L_n$ denotes a normalized L in which all elements of the diagonal are ones, and D represents a diagonal matrix.

Joint detection is known to be an optimal receiver for CDMA systems. One well-known joint detector is implemented using a zero-forcing block linear equalizer (ZF-BLE). Its output may be expressed as:

$$s_{ZF-BLE} = R^{-1} y = L^{-H} L^{-1} y = L_n^{-H} D^{-1/2} L^{-1} y$$

In practice, inversion of lower and upper triangular matrices can be achieved by forward and backward substitution. Therefore, by using Cholesky factorization, no actual matrix inversion is needed for joint detection. Another well-known joint detection technique, zero-forcing block decision feedback equalization (ZF-BDFE), is derived from ZF-BLE by using quantized previous samples, according to the symbol alphabet, in the backward substitution corresponding to the operation of $L_n^{-H}$.

With regard to performance, ZF-BLE joint detection suffers from noise enhancement and thus performs very poorly in bad channel conditions where frequency response has a deep notch. ZF-BDFE joint detection does not have this drawback and therefore usually outperforms ZF-BLE joint detection. However, since the hard decision in conventional ZF-BDFE joint detection is generated by a simple slicer, the performance of ZF-BDFE joint detection will also degrade if the received signal-to-noise-ratio (SNR) is low. Unfortunately, turbo encoded signaling, which will be used in $3^{rd}$ generation (3G) mobile systems, exhibits a low SNR. The improved joint detector disclosed in the co-pending application "METHOD AND APPARATUS FOR JOINT DETECTION OF A CODED SIGNAL IN A CDMA SYSTEM", Ser. No. 09/798,305, filed on Mar. 2, 2001, successfully addresses these deficiencies and provides at least a 1 dB improvement over these conventional joint detectors.

However, the improved joint detector achieves these performance improvements at the cost of computational complexity. For example, for turbo decoding that requires eight iterations, the improved joint detector requires approximately 4 times the computation of the conventional joint detectors. In practice, devices with greater computational requirements cost more to manufacture and have greater energy needs than devices requiring less computation. Thus, a method and apparatus for joint detection that achieves the benefits of the improved joint detector without the increased computational requirements is needed.

DESCRIPTION OF A PREFERRED EMBODIMENT

Figure 1:
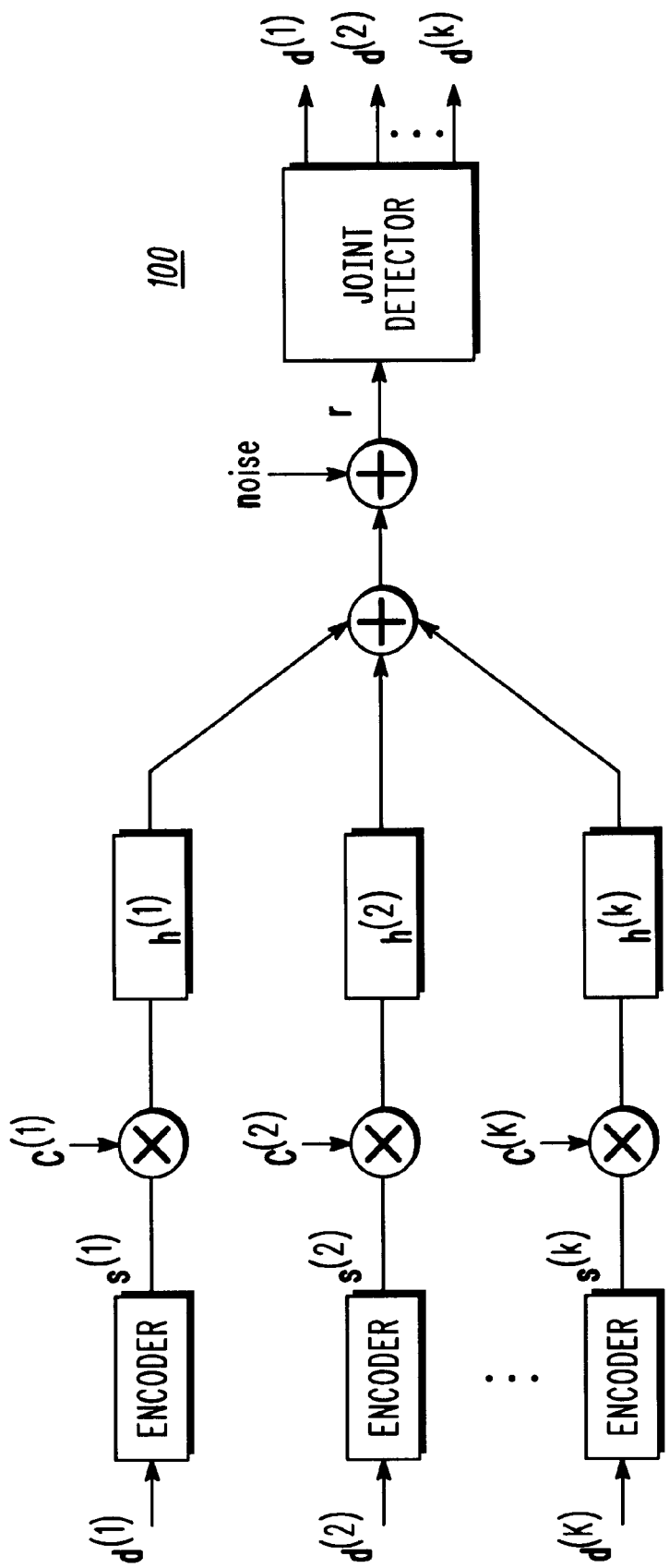
FIG. 1 is a discrete time baseband model of a known CDMA system that supports K block transmission users.

The present invention achieves the benefits of the improved joint detector disclosed in the co-pending application "METHOD AND APPARATUS FOR JOINT DETECTION OF A CODED SIGNAL IN A CDMA SYSTEM," Ser. No.09/798,305,filed on Mar. 2, 2001 with significantly less computation by, first, moving the backward substitution computation outside the detector's decoding iteration loop and, second, by moving the input buffer inside the iteration loop. The backward substitution computation is performed initially as part of a joint detection equalization stage prior to entering the decode iteration loop. Then with each decode iteration, the present invention generates a correction signal that is subtracted from the present input signal to produce the next input signal. Each correction signal is generated from a series of differences between the decoded symbols of the current iteration and those in the previous iteration. Thus, the present invention achieves the same performance improvement over conventional joint detectors as the improved joint detector previously disclosed but with dramatically less computational requirements.

The present invention encompasses a method for joint detection of a coded input signal in CDMA system. The method comprises demultiplexing a first decoder input signal to produce a first plurality of decoder input signal portions, each of which corresponds to a decoder of a plurality of decoders and decoding, by each decoder of the plurality of decoders, the corresponding decoder input signal portion to produce a current set of recovered symbols. A previous set of recovered symbols are subtracted from the current set of recovered symbols to produce a symbol difference. A correction signal is generated from the symbol difference and subtracted from the first decoder input signal to produce a second decoder input signal. The second decoder input signal then is demultiplexed to produce a second plurality of decoder input signal portions, each of which corresponds to a decoder of the plurality of decoders. The corresponding decoder input signal portion of the second plurality of decoder input signal portions is decoded by each decoder to produce a subsequent set of recovered symbols.

The present invention also encompasses a joint detector apparatus. This apparatus comprises a decoder input buffer capable of storing a decoder input signal and a plurality of decoders, wherein each decoder is capable of decoding a portion of the decoder input signal to produce recovered symbols. The apparatus also comprises a demultiplexer, coupled to the decoder input buffer and the plurality of decoders, capable of feeding each portion of the decoder input signal to a corresponding decoder of the plurality of decoders, a recovered symbol buffer, coupled to the plurality of decoders, capable of storing previously recovered symbols, and a correction signal generator, coupled to the recovered symbol buffer and the turbo decoder input buffer, capable of generating a second decoder input signal from the recovered symbols and the previously recovered symbols.

Figure 2:
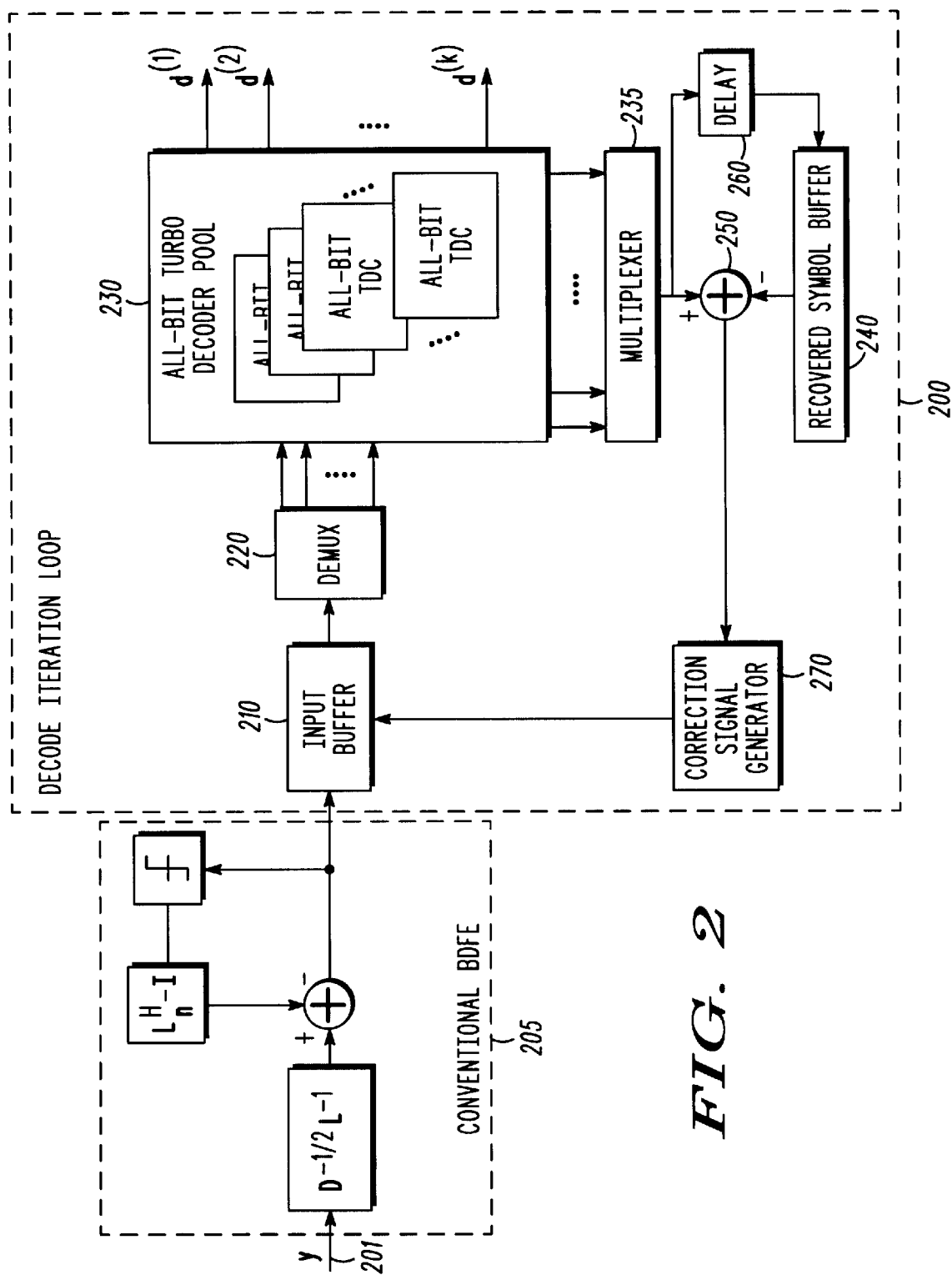
FIG. 2 is a block diagram depiction of a joint detector in accordance with a preferred embodiment of the present invention.
Figure 3:
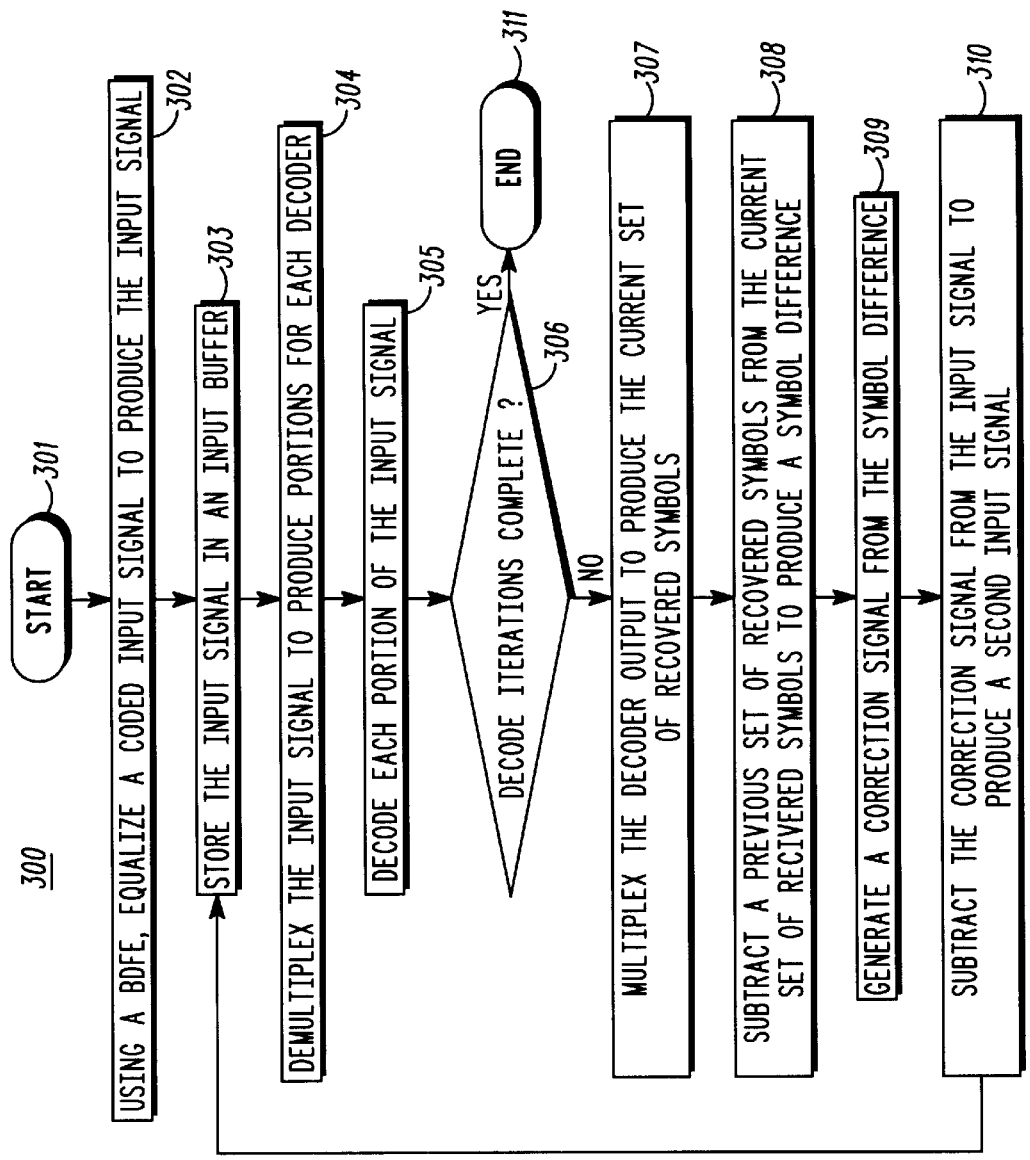
FIG. 3 is a logic flow diagram of steps executed by a joint detector in accordance with the preferred embodiment of the present invention.

The present invention can be more fully understood with reference to FIGS. 2 and 3. FIG. 2 is a block diagram depiction of a joint detector in accordance with a preferred embodiment of the present invention. Filtered signal 201 is preferably the output of a matched filter bank and corresponds to y, as defined above. In the preferred embodiment, feed-forward equalizer 205 comprises functionality of a conventional BDFE as shown in FIG. 2. Alternatively, other conventional joint detector equalization techniques such as linear equalization, minimum-mean-square-error-based equalization, or cochannel interference cancellation may be used instead. The output of equalizer 205, in which precursor ISI and MAI is cancelled, is used as the input signal of the decode iteration loop 200. This input signal preferably comprises a super block of samples, where each sub-block corresponds to a turbo code frame of a user. The input buffer 210 stores a super block of samples at a time. Thus, if K users having the same bit rate and using the same turbo encoder are assumed, then the input buffer 210 stores a super block of samples which correspond to K turbo code frames for K users.

The present invention employs multiple decoders that each decode a portion of the decoder input signal. Demultiplexer 220 feeds each portion of the decoder input signal to a corresponding decoder. In the preferred embodiment, the all-bit turbo decoder pool 230 consists of a number of all-bit turbo decoders that can decode the K turbo code frames in a given time. These all-bit turbo decoders are modified conventional turbo decoders that can generate all coded bits with slightly more computation than conventional turbo decoders (see co-pending application, "TURBO DECODER WITH DECISION FEEDBACK EQUALIZATION"). These all-bit turbo decoders decode all bits of the corresponding decoder input signal portion (i.e., the individual turbo code frames) to produce recovered symbols.

Multiplexer 235 preferably multiplexes the decoder output from decoder pool 230 to each memory element of recovered symbol buffer 240, which stores the recovered symbols produced by decoder pool 230. Preferably, the length of recovered symbol buffer 240 is the total number of symbols corresponding to the super block stored in input buffer 210. Each memory element in the recovered symbol buffer preferably only holds the most reliable hard decision of that symbol (i.e., a "1" or "−1"), which in practice is associated with the most recent iteration and is assigned for a particular symbol as follows:

$$(s_1^{(1)}, s_1^{(2)}, \ldots, s_1^{(K)}, s_2^{(1)}, s_2^{(2)}, \ldots, s_2^{(K)}, s_3^{(1)}, \ldots, s_{KM}^{(1)}, \ldots, s_{KM}^{(K)})$$

where M is the turbo code frame length. In other words, a particular all-bit turbo decoder output is stored in a fixed memory element (a 1 bit element) and the content of the memory element is updated for each iteration.

Preferably, delay element 260 and symbol subtractor 250 are included between multiplexer 235 and recovered symbol buffer 240. Delay element 260 ensures that before the decoder pool recovered symbols of the present iteration are stored in recovered symbol buffer 240, symbol subtractor 250 subtracts the previously recovered symbol stored in recovered symbol buffer 240 from the recovered symbol to produce a symbol difference. After this subtraction occurs, the recovered symbols are stored in recovered symbol buffer 240 for use in the next decode iteration. For the first decode iteration, recovered symbol buffer 240 preferably contains all zeros.

Finally, to complete the present iteration, correction signal generator 270 generates a correction signal from the symbol difference and subtracts this correction signal from the previous decoder input signal in input buffer 210 to generate the decoder input signal for the following decode iteration, which overwrites the previous decoder input signal in input buffer 210. Clearly, this preferred embodiment of the present invention can continue to perform as many iterations as are required to decode the input signal. Turbo coded signals, for example, typically require eight iterations.

A somewhat more rigorous expression of preferred decode iteration loop 200 follows. The input to decode iteration loop 200 can be expressed as x=y'−Ts, where $T=L_n^H-I$ is a banded upper triangular matrix, $y'=(y'_1, y'_2, \ldots, y'_{KM})$ and $s=(s_1, s_2, \ldots, s_{KM})^t$ are samples and detected symbols of K turbo code frames for K users, respectively. Assume T is band limited within 2K, that is $t_{i,j}=0$ for all $j \leq i$ and $j \geq i+2K$, the input to turbo decoders can be written as $$x_1 = y'_1 - t_{1,2}s_2 - t_{1,3}s_3 - \ldots - t_{1,2K}s_{2K}$$

$$x_2 = y'_2 - t_{2,3}s_3 - t_{2,4}s_4 - \ldots - t_{2,2K+1}s_{2K+1}$$

$$x_i = y'_i - t_{i,i+1}s_{i+1} - t_{i,i+2}s_{i+2} - \ldots - t_{i,2K+i-1}s_{2K+i-1}$$

$$x_{KM-1} = y'_{KM-1} - t_{KM-1,KM}s_{KM}$$

$$x_{KM} = y'_{KM}$$

Here y' is a constant vector and x and s are variable vectors that may change as the turbo decoding iteration progress. In fact, x and s correspond to the contents of input buffer 210 and recovered symbol buffer 240 during the decode iterations of filtered signal 201, y. Therefore, the difference $x_i$ between the current iteration and the previous iteration can be expressed as $$x_i^n - x_i^o = -t_{i,i+1}(s_{i+1}^n - s_{i+1}^o) - t_{i,i+2}(s_{i+2}^n - s_{i+2}^o) - t_{i,2K+i-1}^n - s_{2K+i-1}^o)$$

and the current input is expressed as $$x_i^n = x_i^o - t_{i,i+1}(s_{i+1}^n - s_{i+1}^o) - t_{i,i+2}(s_{i+2}^n - s_{i+2}^o) - t_{i,2K+i-1}^n - s_{K+i-1}^o)$$

where superscript "n" and "o" stand for new and old. As the turbo decoding iteration progresses, $s_i^o$ and $s_i^n$ tend to be the same. So $x_i^o \rightarrow x_i^n$. Because of the convergency property of turbo decoding, the majority of $(s_i^n, s_i^o)$ pairs are the same after the first iteration. The maximum number of discrepancies is usually less than 15% of total samples and becomes smaller and smaller with each iteration. Correction signals are generated only for those pairs of $(s_i^n, s_i^o)$ that $s_i^o$ and $s_i^n$ are different. Specifically, for each discrepancy pair $(s_i^n, s_i^o)$, at most 2K−1 correction signals are generated as $t_{i-1,i}(s_i^n - s_i^o)$, $t_{i-2,i}(s_i^n - s_i^o)$, ..., $t_{i-2K+1,i}(s_i^n - s_i^o)$, subtracted separately from $x_{i-1}^o$, $x_{i-2}^o$, ..., $x_{i-2K+1}$, and stored in input buffer 210 for the next iteration.

FIG. 3 is a logic flow diagram 300 of steps executed by a joint detector in accordance with the preferred embodiment of the present invention. The logic flow preferably begins (301) with the step of equalizing (302) a coded input signal with a block decision feedback equalizer to produce the first decoder input signal. This input signal is stored (303) in a turbo decoder input buffer and demultiplexed (304) to produce a first group of decoder input signal portions. Each of these signal portions then is decoded (305) by one of the decoders in the pool of decoders and multiplexed (307) to produce a current set of recovered symbols.

Before being stored in a recovered symbol buffer, these recovered symbols have the set of previously recovered symbols subtracted (308) from them to produce a symbol difference. A correction signal is generated (309) from this symbol difference and subtracted (310) from the first decoder input signal to produce a second decoder input signal. At this point, the logic flow returns to step 303 to begin a subsequent iteration. The second input signal is stored (303) in the input buffer, demultiplexed (304), and decoded (305). Step 306 is shown to illustrate that this cycle of iterations stops (311) when the decoding is complete. In the preferred embodiment where the decoders are turbo decoders, the decoding is complete after eight iterations, for example.

Figure 4:
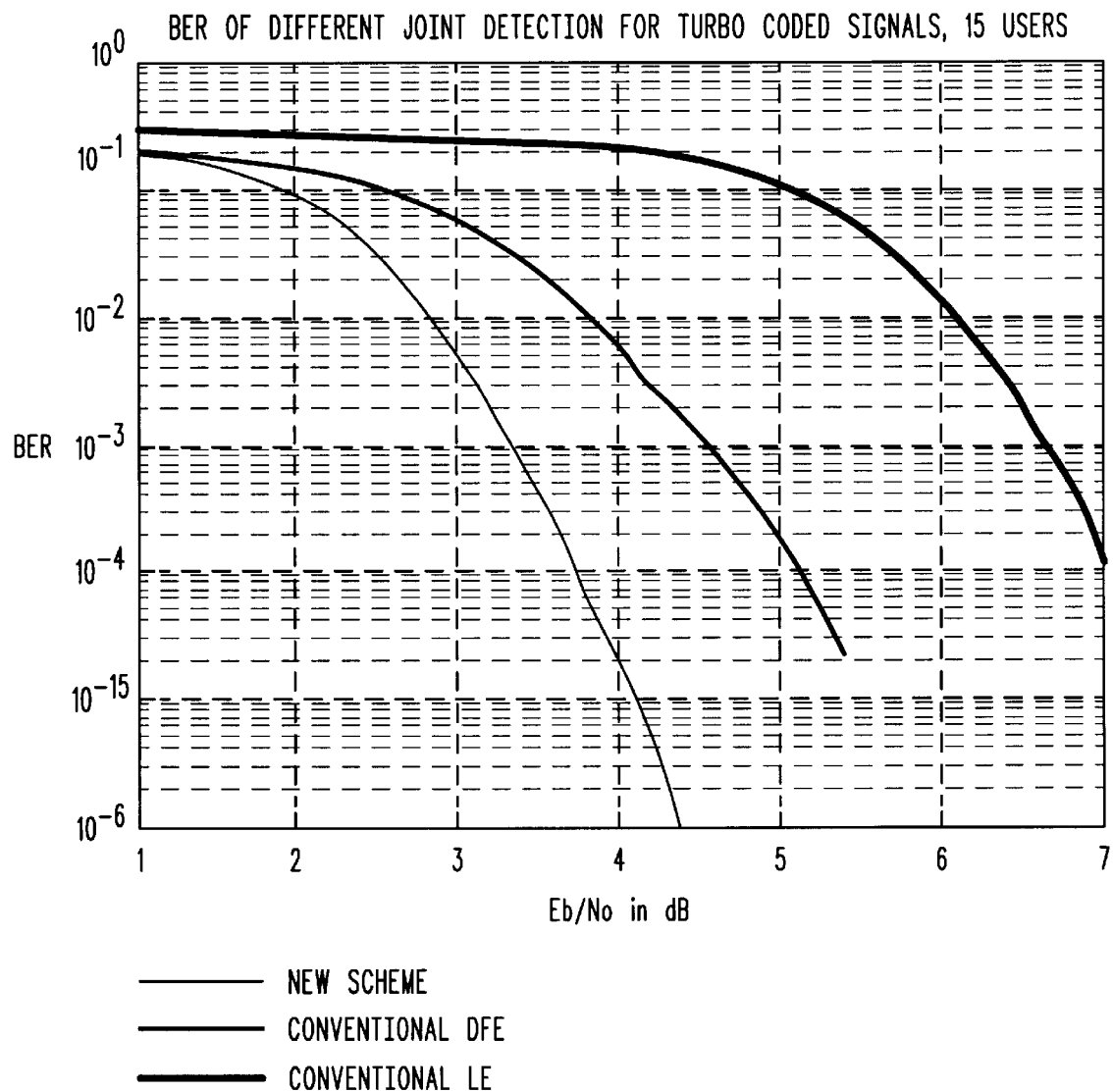
FIG. 4 is a graph comparing bit error rates of joint detection by prior art techniques to those of the preferred embodiment of the present invention.

FIG. 4 is a graph comparing bit error rates of conventional joint detection by prior art techniques to those of the preferred embodiment of the present invention. Specifically, the graph shows simulation results for 15 turbo-coded users (i.e., K=15 with the decoding terminated at the $8^{th}$ iteration) for conventional DFE (i.e., ZF-BDFE joint detection) and conventional LE (i.e., ZF-BLE joint detection) as compared to the new scheme (i.e., the preferred embodiment of the present invention). The results show that the preferred embodiment outperforms ZF-BDFE joint detection (with turbo decoder) by more than 1 dB and ZF-BLE joint detection (with turbo decoder) by more than 3 dB.

These are the same improvements achieved by the improved joint detector disclosed in the co-pending application "METHOD AND APPARATUS FOR JOINT DETECTION OF A CODED SIGNAL IN A CDMA SYSTEM", Ser. No. 09/798,305, filed on Mar. 2, 2001. However, the present invention is significantly less computationally complex than the improved joint detector. For relatively high Eb/No signals, 4 dB or more, for example, the present invention only requires 3% of the computation required by the improved joint detector to achieve a frame error rate of 0.001.

While the present invention has been particularly shown and described with reference to particular embodiments thereof, it will be understood by those skilled in the art that various changes in form and details may be made therein without departing from the spirit and scope of the present invention.

What is claimed is:

1. A method for joint detection of a coded input signal in CDMA system comprising:

demultiplexing a first decoder input signal to produce a first plurality of decoder input signal portions, each of which corresponds to a decoder of a plurality of decoders;

decoding, by each decoder of the plurality of decoders, the corresponding decoder input signal portion of the first plurality of decoder input signal portions to produce a current set of recovered symbols;

subtracting a previous set of recovered symbols from the current set of recovered symbols to produce a symbol difference;

generating a correction signal from the symbol difference;

subtracting the correction signal from the first decoder input signal to produce a second decoder input signal;

demultiplexing the second decoder input signal to produce a second plurality of decoder input signal portions, each of which corresponds to a decoder of the plurality of decoders;

decoding, by each decoder of the plurality of decoders, the corresponding decoder input signal portion of the second plurality of decoder input signal portions to produce a subsequent set of recovered symbols.

2. The method of claim 1 further comprising the step of equalizing a coded input signal with a block decision feedback equalizer to produce the first decoder input signal.

3. The method of claim 1 further comprising the step of storing the first decoder input signal in a decoder input buffer prior to the step of demultiplexing the first decoder input signal.

4. The method of claim 1 wherein the step of decoding to produce the current set of recovered symbols comprises the step of multiplexing decoder output of the plurality of decoders to produce the current set of recovered symbols.

5. The method of claim 4 further comprising the step of storing, subsequent to the step of subtracting the previous set of recovered symbols from the current set of recovered symbols, the current set of recovered symbols, s, in a recovered symbol buffer in the following order:

$$(s_1^{(1)}, s_1^{(2)}, \ldots, s_1^{(K)}, s_2^{(1)}, s_2^{(2)}, \ldots, s_2^{(K)}, s_3^{(1)}, \ldots, s_{KM}^{(1)}, \ldots, s_{KM}^{(K)})$$

wherein M is the length of code frames in the first decoder input signal and K is the number of code frames in the first decoder input signal.

6. The method of claim 1 further comprising the step of storing the second decoder input signal in a decoder input buffer prior to the step of demultiplexing the second decoder input signal.

7. The method of claim 1 wherein the plurality of decoders comprises an all-bit turbo decoder that decodes all bits of the corresponding decoder input signal portion.

8. A CDMA joint detector apparatus comprising:
   a decoder input buffer capable of storing a decoder input signal;
   a plurality of decoders, wherein each decoder is capable of decoding a portion of the decoder input signal to produce recovered symbols;
   a demultiplexer, coupled to the decoder input buffer and the plurality of decoders, capable of feeding each portion of the decoder input signal to a corresponding decoder of the plurality of decoders;
   a recovered symbol buffer, coupled to the plurality of decoders, capable of storing previously recovered symbols; and
   a correction signal generator, coupled to the recovered symbol buffer and the decoder input buffer, capable of generating a second decoder input signal from the recovered symbols and the previously recovered symbols.

9. The apparatus of claim 8 further comprising a block decision feedback equalizer capable of generating a first decoder input signal.

10. The apparatus of claim 8 further comprising a symbol subtractor, coupled to the recovered symbol buffer and the correction signal generator, capable of subtracting the previously recovered symbols from the recovered symbols to produce a symbol difference.

11. The apparatus of claim 10 wherein the correction signal generator is capable of using the symbol difference to generate a correction signal and capable of subtracting the correction signal from the decoder input signal to generate the second decoder input signal.

12. The apparatus of claim 8 wherein the plurality of decoders comprises decoders selected from the group of decoders consisting of a turbo decoder, a convolutional decoder, and a reed-solomon decoder.

13. The apparatus of claim 8 wherein the plurality of decoders comprises an all-bit turbo decoder that decodes all bits of the corresponding decoder input signal portion.

14. The apparatus of claim 8 wherein the decoder input buffer is capable of storing a super block of samples, each of which corresponds to a turbo code frame of a different signal component of the decoder input signal.

15. The apparatus of claim 8 further comprising a multiplexer, coupled to the plurality of decoders and the recovered symbol buffer, capable of multiplexing decoder output from the plurality of decoders to each memory element of the recovered symbol buffer.

16. The apparatus of claim 15 wherein each memory element of the recovered symbol buffer is assigned for a particular symbol in the following order:

$$(s_1^{(1)}, s_1^{(2)}, \ldots, s_1^{(K)}, s_2^{(1)}, s_2^{(2)}, \ldots, s_2^{(K)}, s_3^{(1)}, \ldots, s_{KM}^{(1)}, \ldots, s_{KM}^{(K)})$$

wherein M is the length of code frames in the decoder input signal and K is the number of code frames in the decoder input signal.

* * * * *